(12) United States Patent
Togashi et al.

(10) Patent No.: US 7,310,218 B2
(45) Date of Patent: Dec. 18, 2007

(54) LAMINATED CERAMIC CAPACITOR

(75) Inventors: Masaaki Togashi, Tokyo (JP); Hiroshi Okuyama, Tokyo (JP); Shinya Suyama, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/670,525

(22) Filed: Feb. 2, 2007

(65) Prior Publication Data

US 2007/0217123 A1    Sep. 20, 2007

(30) Foreign Application Priority Data

Mar. 17, 2006  (JP)  .............................. 2006-074818

(51) Int. Cl.
*H01G 4/228* (2006.01)
*H01G 4/06* (2006.01)

(52) U.S. Cl. .................... 361/306.3; 361/309; 361/311

(58) Field of Classification Search ............. 361/306.3, 361/308.1, 309, 310, 311
See application file for complete search history.

(56) References Cited

U.S. PATENT DOCUMENTS

| | | | |
|---|---|---|---|
| 6,191,932 B1 * | 2/2001 | Kuroda et al. ............... | 361/303 |
| 6,292,351 B1 * | 9/2001 | Ahiko et al. ............. | 361/306.3 |
| 6,940,710 B1 * | 9/2005 | Lee et al. ................ | 361/321.2 |
| 2004/0022009 A1 * | 2/2004 | Galvagni et al. ......... | 361/306.3 |
| 2006/0120018 A1 * | 6/2006 | Lee et al. ................ | 361/306.3 |
| 2007/0064374 A1 | 3/2007 | Togashi et al. | |

FOREIGN PATENT DOCUMENTS

JP    2000-208361    7/2000

OTHER PUBLICATIONS

U.S. Appl. No. 11/670,528, filed Feb. 2, 2007, Togashi.

* cited by examiner

*Primary Examiner*—Eric Thomas
(74) *Attorney, Agent, or Firm*—Oblon, Spivak, McClelland, Maier & Neustadt, P.C.

(57) ABSTRACT

A laminated ceramic capacitor includes a body having an inner layer portion and an outer layer portion and a plurality of terminal electrodes spaced apart from each other in a length direction of the body. The inner layer portion has a plurality of internal electrodes stacked in a height direction of the body. The internal electrodes have led-out portions led out to a side face of the body. The outer layer portion is disposed on one of opposite faces of the inner layer portion in the height direction. Each terminal electrode extends along the height direction to cover corresponding one of the led-out portions and is provided with an intermediate portion and an end portion. The intermediate portion has a larger electrode width than the led-out portion. The end portion has a smaller electrode width at an edge of the side face than the intermediate portion.

20 Claims, 10 Drawing Sheets

LAMINATED CERAMIC CAPACITOR

BACKGROUND OF THE INVENTION

1. Field of the Invention

The present invention relates to a multi-terminal laminated ceramic capacitor with low ESL.

2. Description of the Related Art

Such laminated ceramic capacitors have been required to have ESL reduced with increase in frequency of electronic devices on which the capacitors are to be mounted. As means for realizing low ESL, Japanese Unexamined Patent Application Publication No. 2000-208361 discloses increasing the electrode width of terminal electrodes.

Recently, furthermore, the market demand for miniaturization of electronic devices has been rapidly increasing, and further miniaturization of laminated ceramic capacitors to be mounted thereon is also demanded in accordance with the technical trend.

Under normal conditions, however, the miniaturization of laminated ceramic capacitors necessarily reduces the electrode width of terminal electrodes, contrary to the demand for low ESL.

In addition, reducing the electrode width of terminal electrodes greatly increases the risk of undesirable exposure of internal electrodes, causing decrease in the manufacturing yield and the reliability.

In multi-terminal laminated ceramic capacitors on which many terminal electrodes have to be formed, moreover, increasing the electrode width of terminal electrodes to realize low ESL and prevent undesirable exposure of internal electrodes results in decreasing the pitch between adjacent terminal electrodes. This greatly increases the risk of short-circuit failure between adjacent terminal electrodes, for example, due to occurrence of solder bridging during soldering to a mounting substrate.

SUMMARY OF THE INVENTION

It is an object of the present invention to provide a multi-terminal laminated ceramic capacitor with low ESL.

It is another object of the present invention to provide a laminated ceramic capacitor with excellent manufacturing yield.

It is still another object of the present invention to provide a laminated ceramic capacitor with high reliability.

In order to attain at least one of the above objects, the present invention provides a laminated ceramic capacitor comprising a body and a plurality of terminal electrodes. The body has an inner layer portion and an outer layer portion. The inner layer portion has a plurality of internal electrodes stacked in a height direction of the body, and the internal electrodes have led-out portions led out to a side face of the body. The outer layer portion is disposed on at least one of opposite faces of the inner layer portion in the height direction. The terminal electrodes are spaced apart from each other in a length direction of the body perpendicular to the height direction and each extend along the height direction to cover corresponding one of the led-out portions.

In addition to the above-described basic structure of a multi-terminal laminated ceramic capacitor, the present invention is characterized in that at least outermost ones of the terminal electrodes in the length direction are each provided with an intermediate portion and an end portion, the intermediate portion has a larger electrode width than the led-out portion, and the end portion has a smaller electrode width at an edge of the side face than the intermediate portion. In this configuration, since at least the outermost terminal electrodes have a smaller width at the end portion than at the intermediate portion, the terminal electrodes adjacent each other in the length direction ensures a sufficient distance between their end portions. This reduces the risk of occurrence of solder bridging between the adjacent end portions during soldering to a mounting substrate, thereby preventing short-circuit failure.

Moreover, the intermediate portion of the terminal electrode, which has a larger electrode width than the end portion and the led-out portion and may be a central bulge of a barrel-shape, enables further reduction of ESL in a miniaturized laminated ceramic capacitor, thereby improving the high-frequency characteristic of the capacitor.

Furthermore, the intermediate portion of the terminal electrode prevents undesirable exposure of the led-out portion, thereby improving the reliability, the manufacturing yield and the productivity of the laminated ceramic capacitor.

The present invention will be more fully understood from the detailed description given hereinbelow and the accompanying drawings which are given by way of illustration only, and thus are not to be considered as limiting the present invention.

DESCRIPTION OF THE PREFERRED EMBODIMENTS

Figure 1:
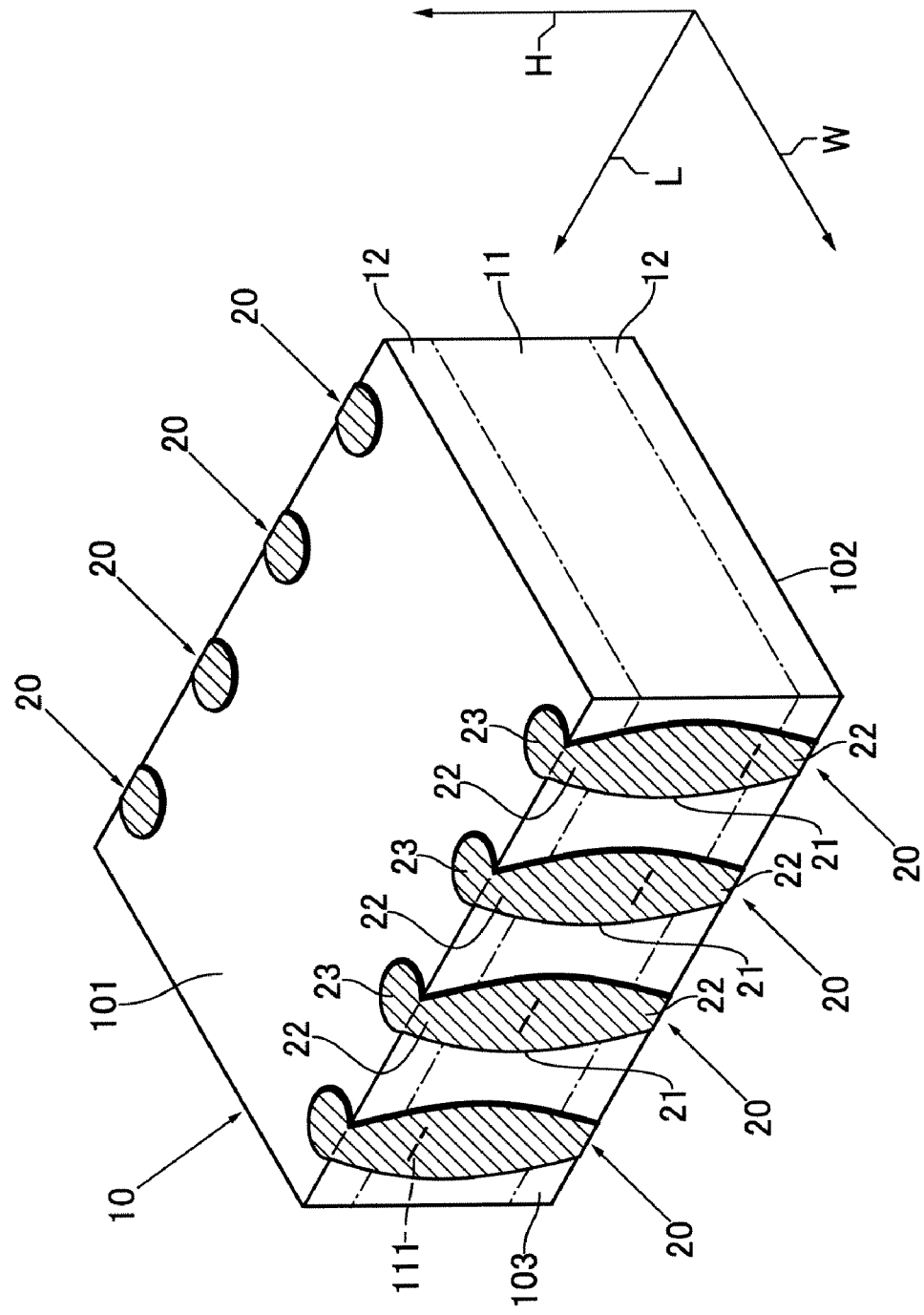
FIG. 1 is a perspective view of a laminated ceramic capacitor according to one embodiment of the present invention.

In a laminated ceramic capacitor shown in FIGS. 1 to 4, a body 10 is a hexahedron having one face 101 and another face 102 opposite from the face 101 in a height direction H. The body 10 has a height T and is composed inner and outer layer portions 11 and 12.

The inner layer portion 11 is formed by stacking a predetermined number of dielectric layers 112 in the height direction H, wherein the dielectric layer 112 is mainly composed of a ceramic dielectric material and an internal electrode 110 mainly composed of a conductive metallic material is patterned on one surface of the dielectric layer 112. In order to realize low ESL, it is preferred that the polarity is different between adjacent ones of the internal electrodes 110 in the height direction H.

Each internal electrode 110 has at least one led-out portion 111 that is used as a so-called "extraction electrode". The led-out portion 111 is led out to at least one of two opposite side faces 103 of the body 10 in a width direction W.

Figure 2:
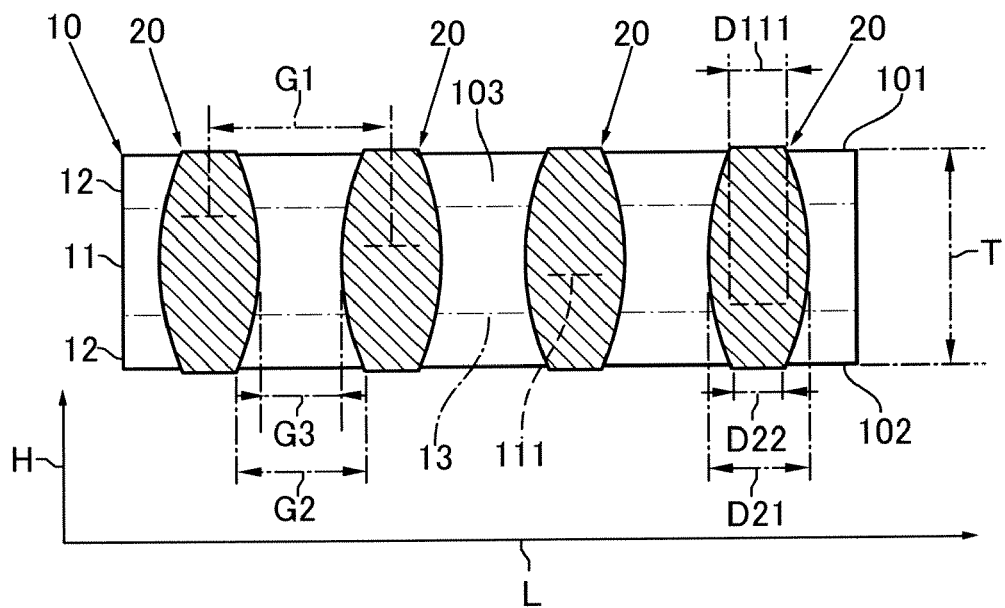
FIG. 2 is a side view of the laminated ceramic capacitor shown in FIG. 1.
Figure 3:
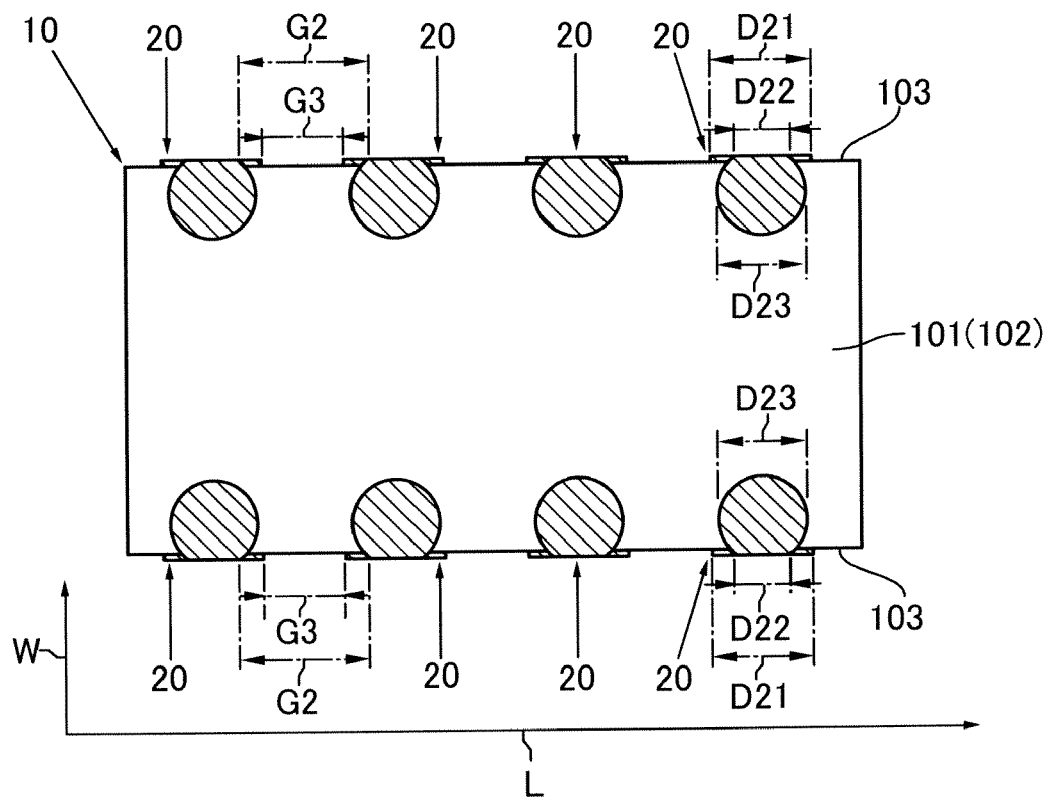
FIG. 3 is a plan view of the laminated ceramic capacitor shown in FIG. 1.
Figure 4:
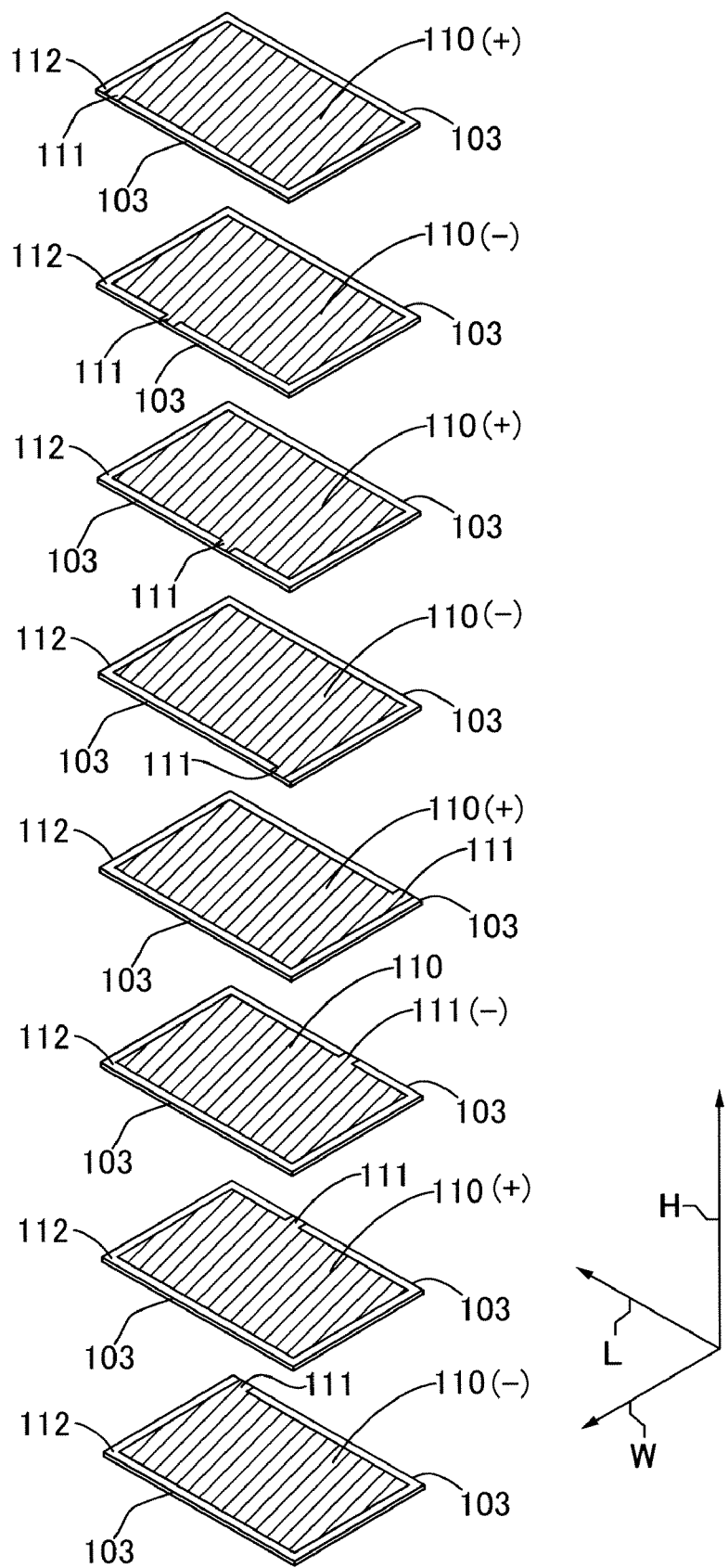
FIG. 4 is an exploded perspective view showing a layered structure of an inner layer portion of the laminated ceramic capacitor shown in FIGS. 1 to 3.

Between the adjacent internal electrodes 110 in the height direction H, the led-out portions 111 are spaced at an interval G1 in a length direction L of the body 10 perpendicular to the height direction H (see FIG. 2). The interval G1 is a center-to-center distance between the adjacent led-out portions 111, where the center of each led-out portion 111 refers to the midpoint of an electrode width D111.

On both faces of the inner layer portion 11 which oppose each other in the height direction H, the outer layer portion 12 is preferably formed by stacking only a predetermined number of the dielectric layers 112 in the height direction H. In the body 10 shown in FIGS. 1 to 4, accordingly, the inner layer portion 11 is sandwiched by two outer layer portions 12 from above and below in the height direction H, wherein outwardly-directed faces of the outer layer portions 12 are designated by 101 and 102, respectively.

Furthermore, the laminated ceramic capacitor shown in FIGS. 1 to 4 has a plurality of terminal electrodes 20. These terminal electrodes 20 are mainly composed of a conductive metallic material and extend along the height direction H to cover the led-out portions 111 on the side faces 103, while being spaced by distances G2 and G3 in the length direction L of the body 10 perpendicular to the height direction H. The distance G3 is preferably equal to or greater than 100 μm.

In order to realize low ESL, it is preferred that the adjacent terminal electrodes 20 in the length direction L have different polarities depending on the polarities of the corresponding internal electrodes 110.

In addition to the above-described basic structure of a multi-terminal laminated ceramic capacitor, the laminated ceramic capacitor shown in FIGS. 1 to 4 is characterized in that the terminal electrodes 20 have a unique shape. More specifically, the terminal electrodes 20 are each provided with an intermediate portion 21, terminal portions 22 and grounding portions 23.

The intermediate portion 21 has a maximum electrode width D21 which is larger than the electrode width D111 of the led-out portion 111. At opposite edges of the side face 103 in the height direction H, the end portion 22 has an electrode width D22 which is smaller than the maximum electrode width D21 of the intermediate portion 21 and equal to or larger than the electrode width D111 of the led-out portion 111. As seen in the side face 103, more specifically, the terminal electrode 20 has a tapered-shape whose electrode width gradually decreases from the intermediate portion 21 toward the end portions 22.

Typically, it is preferred that the electrode width D22 is approximately equal to the electrode width D111. Furthermore, the ratio of the maximum electrode width D21 to the electrode width D22 may be set as follows: $1.10 \leq D21/D22 \leq 1.5$.

The grounding portions 23, which have a fan-shape with a maximum electrode width D23, are disposed on the opposite faces 101 and 102 of the body 10 and electrically connected to the end portions 22 at the edges of the side faces 103. With this configuration, the laminated ceramic capacitor can be mounted regardless of its direction or which one of the faces 101 and 102 is used as a substrate mounting face. The electrode width relationship of the intermediate portion 21, the end portion 22 and the grounding portion 23 may be set as follows: $D22 < D23 < D21$.

The laminated ceramic capacitor described above with reference to FIGS. 1 to 4 has the following effects. First of all, since the terminal electrodes 20 are tapered to have a smaller width at the end portions 22 than at the intermediate portion 21, the terminal electrodes 20 adjacent each other in the length direction L ensures a sufficient distance G2 between their end portions 22. This reduces the risk of occurrence of solder bridging between the end portions 22 across the area having a distance varying from G3 to G2, for example, during soldering to a mounting substrate, thereby preventing short-circuit failure.

In addition, if the electrode width relationship of the intermediate portion 21, the end portion 22 and the grounding portion 23 is $D22 < D23 < D21$, the short-circuit failure due to solder bridging can also be prevented between adjacent grounding portions 23, while ensuring a sufficient area for soldering of the grounding portions 23 to the mounting substrate.

Moreover, the intermediate portion 21 of the terminal electrode 20, whose electrode width D21 is larger than the electrode width D111 of the led-out portion 111 and which is a central bulge of a barrel-shape with the end portions 22 at both ends thereof, enables further reduction of ESL in a miniaturized laminated ceramic capacitor, improving the high-frequency characteristic of the capacitor.

With the electrode width D21 being larger than the electrode width D111, for example, an offset generated between the intermediate portion 21 and the led-out portion 111 upon formation of the terminal electrode 20 can be accommodated by the electrode width difference (or margin) therebetween, certainly preventing undesirable exposure of the led-out portion 111. This improves the manufacturing yield, the productivity and the reliability of the laminated ceramic capacitor.

Next will be described the concrete effects of reducing ESL and improving reliability of the laminated ceramic capacitor of FIGS. 1 to 4 with reference to FIGS. 5 to 7.

Figure 5:
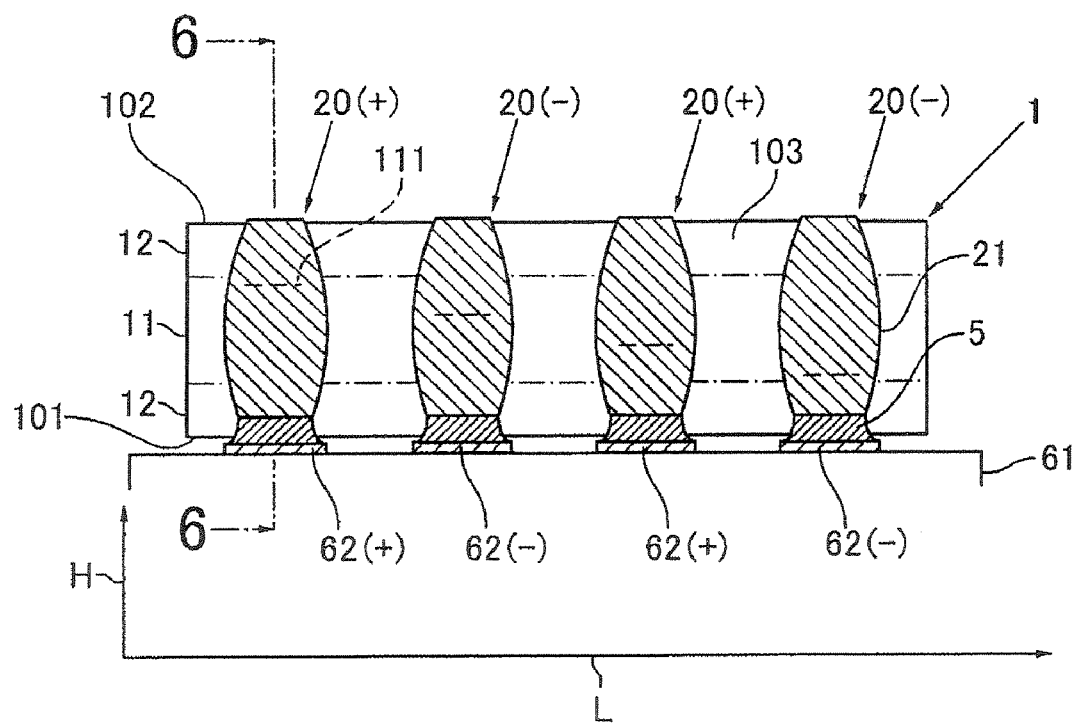
FIG. 5 is a side view, with parts omitted, showing an electronic device with a laminated ceramic capacitor according to one embodiment of the present invention.
Figure 6:
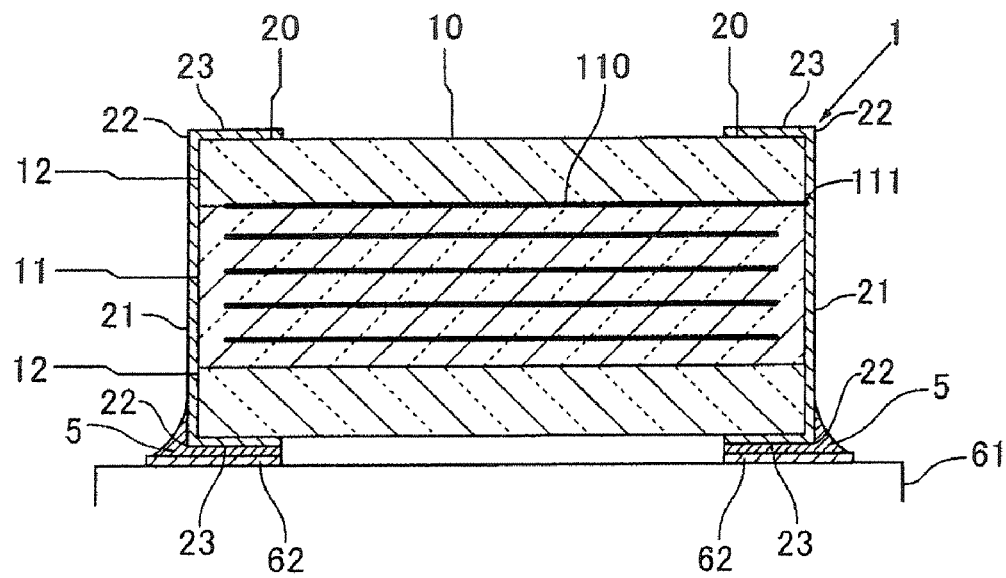
FIG. 6 is a sectional view taken along line 6-6 of FIG. 5.

In an electronic device shown in FIGS. 5 and 6, the end portions 22 and the grounding portions 23 of the terminal electrodes 20 of a laminated ceramic capacitor 1 are secured to a circuit pattern 62 formed on a substrate 61 through solder layers 5, wherein the joining through the solder layers 5 electrically connects the circuit pattern 62 to the internal electrodes 110. The adjacent elements of the circuit pattern 62 have opposite polarities and are electrically connected to the terminal electrodes 20 depending on their polarities.

An ESL-reducing effect of the terminal electrode 20 when applying current to the electronic device of FIGS. 5 and 6 under the conditions of Table 1 will be described with reference to Table 1 and FIG. 7 where the data of Table 1 are plotted.

TABLE 1

| G1(μm) | D21(μm) | D22(μm) | D21/D22 | ESL values (pH) | mounting failure |
|---|---|---|---|---|---|
| 400 | 249 | 249 | 1.00 | 63.7 | 4/300 |
| 400 | 248 | 237 | 1.05 | 64.2 | 1/300 |
| 400 | 248 | 225 | 1.10 | 64.6 | 0/300 |
| 400 | 252 | 202 | 1.25 | 65.5 | 0/300 |
| 400 | 249 | 166 | 1.50 | 66.9 | 0/300 |
| 400 | 249 | 140 | 1.78 | 75.3 | 0/300 |
| 400 | 249 | 117 | 2.13 | 83.0 | 0/300 |

Figure 7:
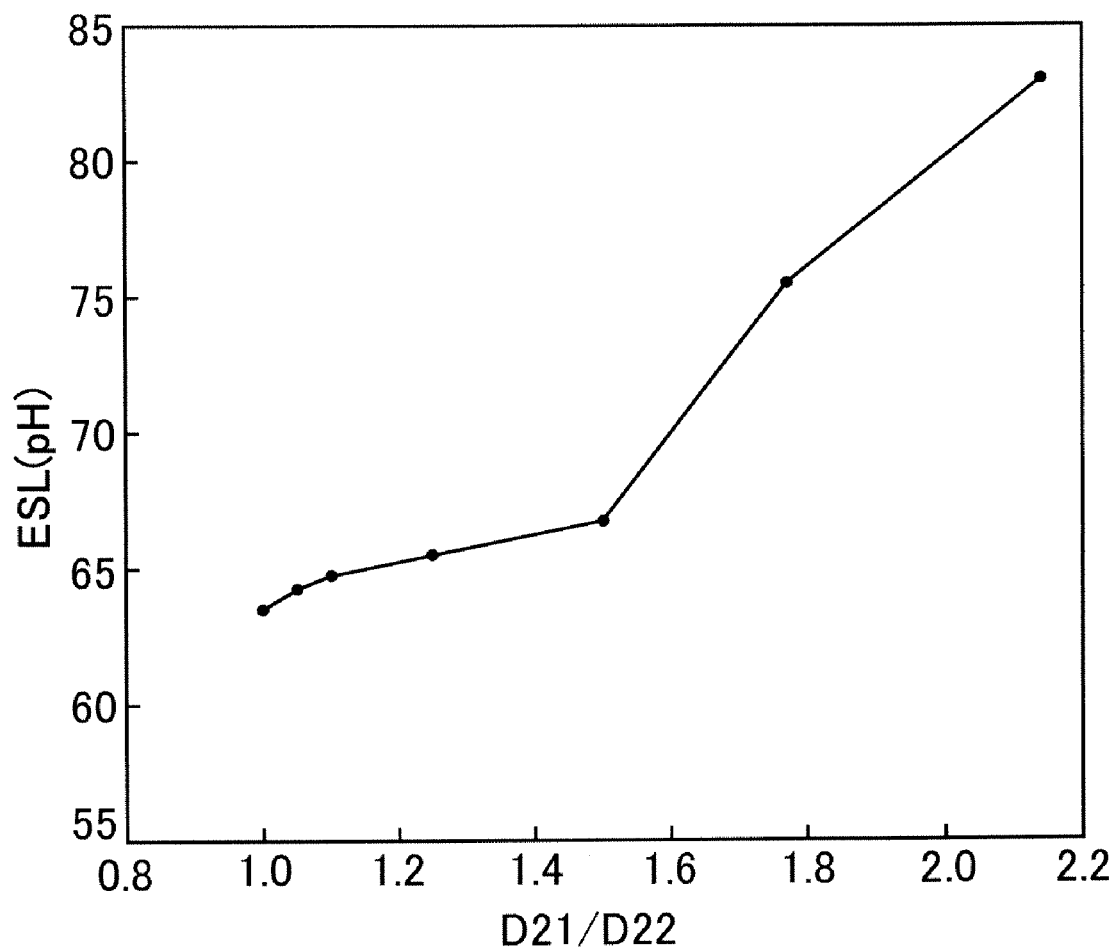
FIG. 7 is a diagram showing experimental data on the electronic device shown in FIGS. 5 and 6.

It is seen from Table 1 and FIG. 7 that when the electrode width ratio D21/D22, i.e., the ratio of the electrode width D21 of the intermediate portion 21 to the electrode width D22 of the end portion 22 was 1.00 and 1.05, the mounting failure occurred at a rate of 4/300 and 1/300, respectively, although ESL was as low as 63.7 (pH) and 64.2 (pH). This means that the short-circuit failure due to solder bridging occurred across the distance (G2) between the adjacent end portions 22.

It is also seen that when the electrode width ratio D21/D22 was 1.78 and 2.13, ESL was as high as 75.3 (pH) and 83.0 (pH), respectively, although the mounting failure did not occur (i.e., 0/300). This means that ESL sharply increased when the electrode width ratio D21/D22 exceeded 1.50.

On the other hand, when the electrode width ratio D21/D22 was 1.10, 1.25 and 1.50, ESL was as low as 64.6 (pH), 65.5 (pH) and 66.9 (pH), respectively, and the mounting failure did not occur (i.e., 0/300). Thus, reducing ESL of the terminal electrodes 20 while avoiding the mounting failure could be realized by setting the electrode width ratio D21/D22 as follows: $1.10 \leq D21/D22 \leq 1.50$.

Figure 8:
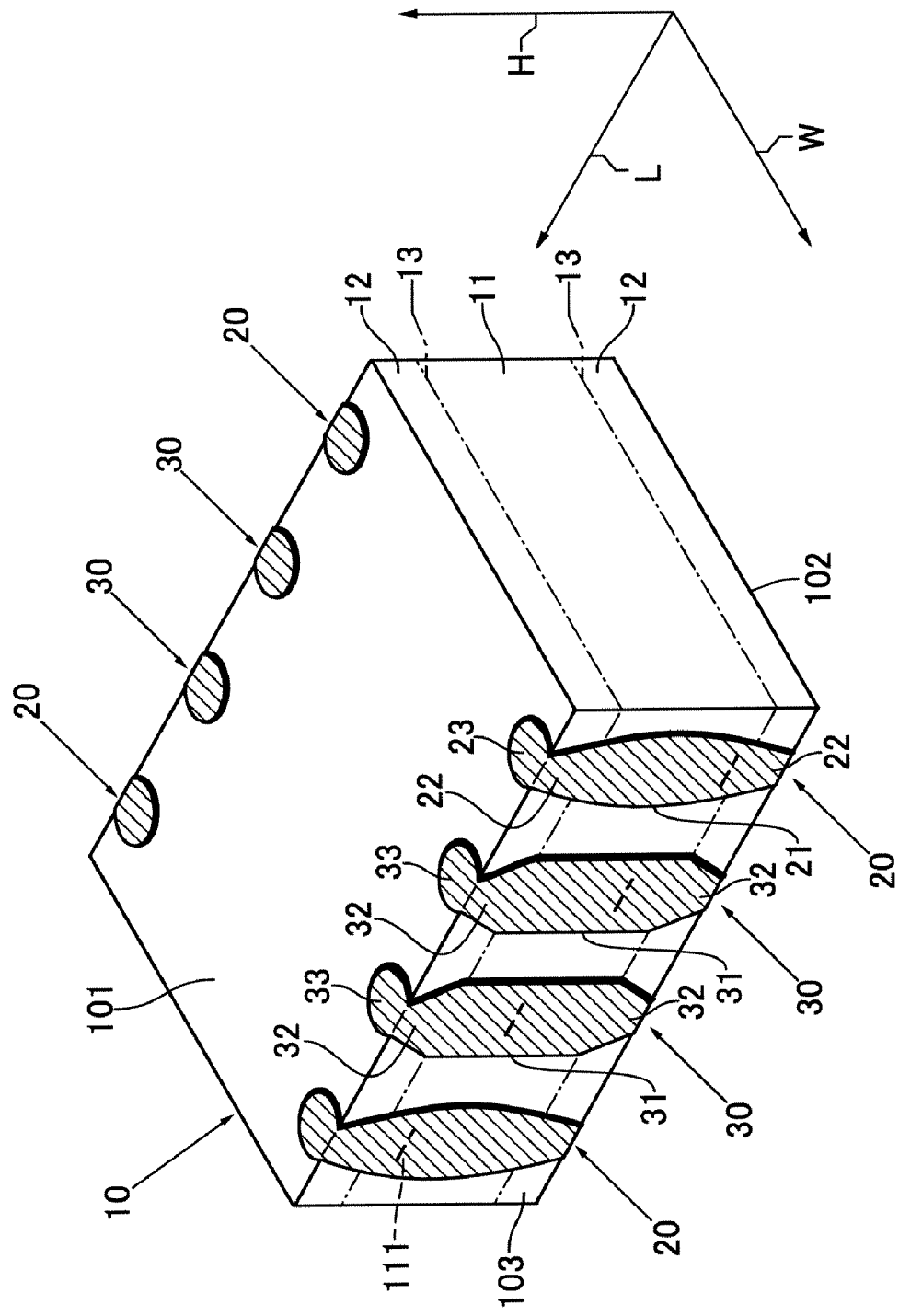
FIG. 8 is a perspective view of a laminated ceramic capacitor according to another embodiment of the present invention.
Figure 9:
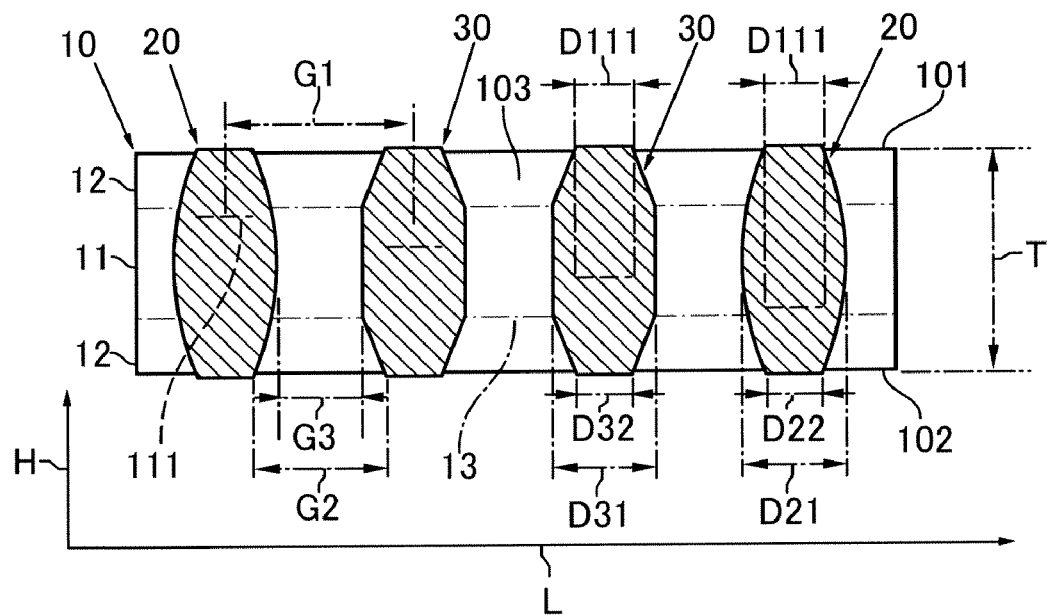
FIG. 9 is a side view of the laminated ceramic capacitor shown in FIG. 8.
Figure 10:
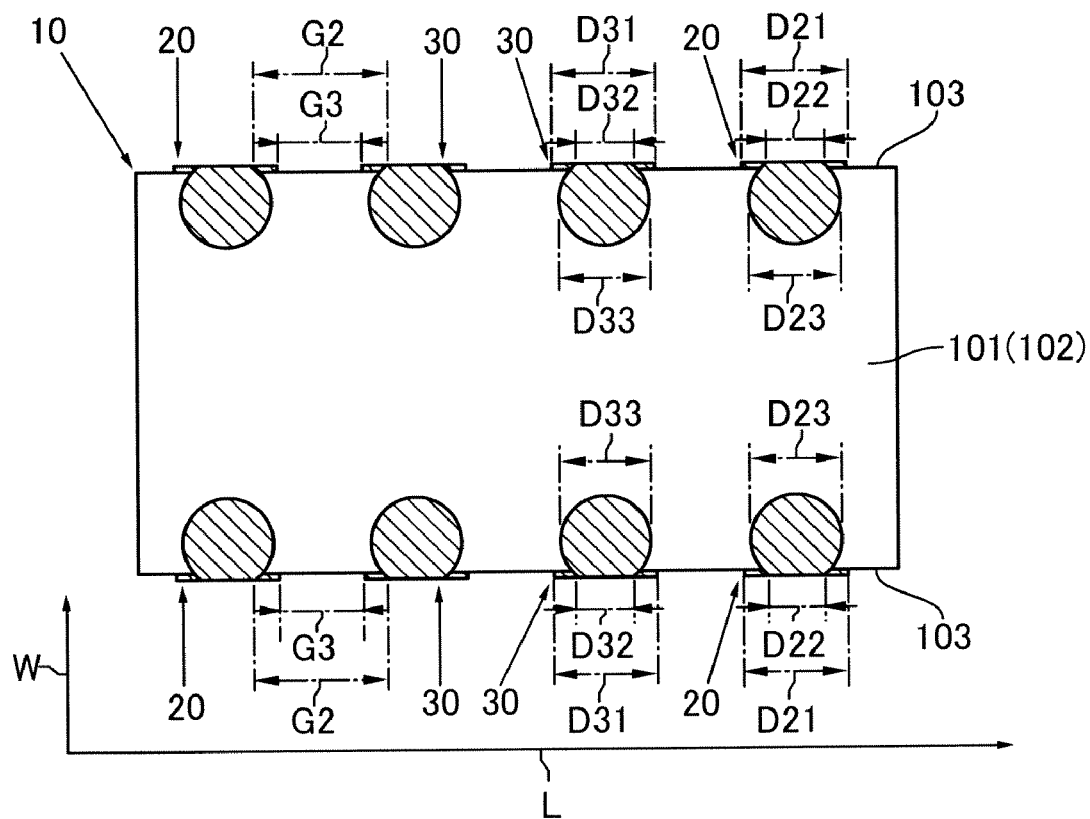
FIG. 10 is a plan view of the laminated ceramic capacitor shown in FIG. 8.
Figure 11:
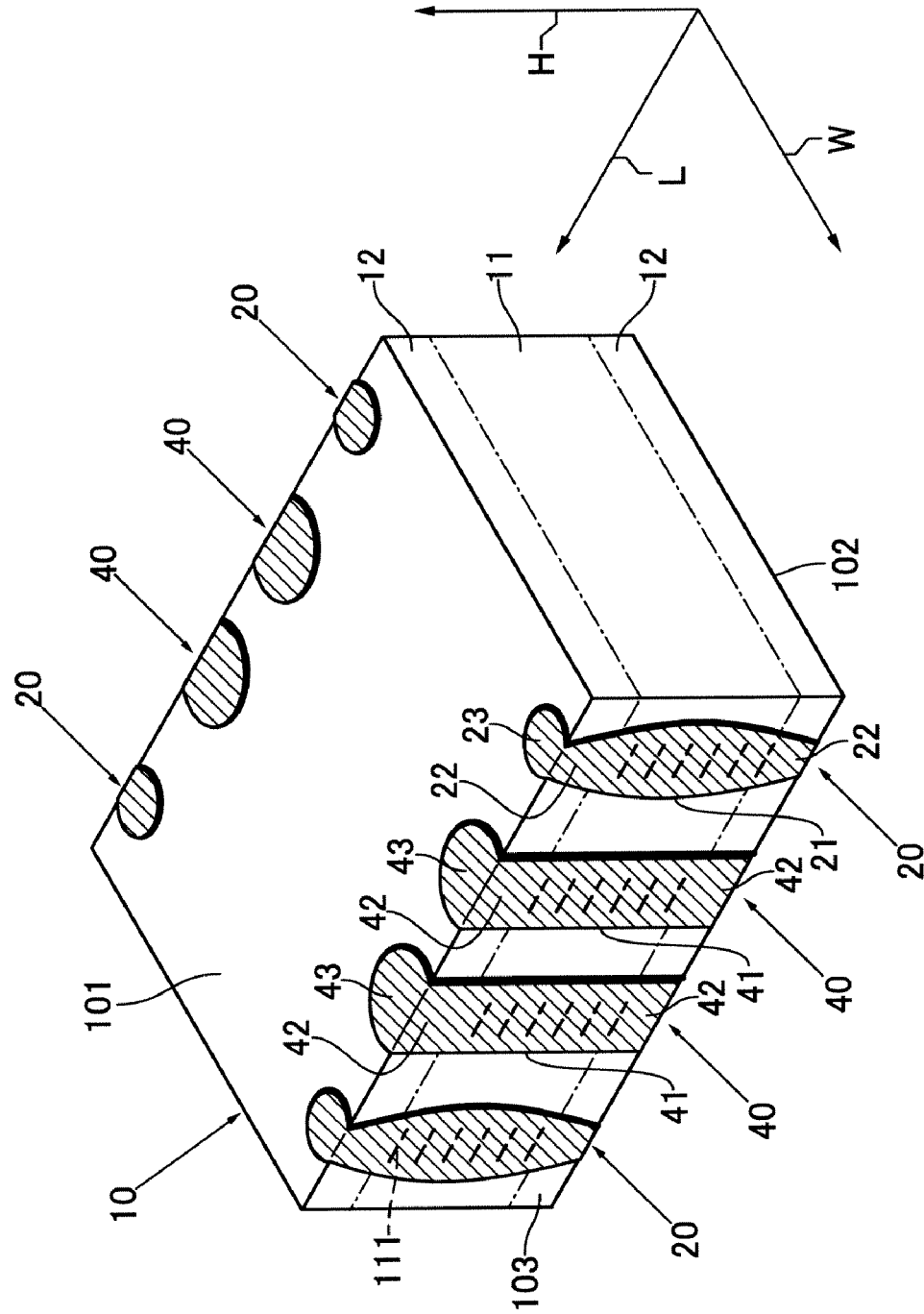
FIG. 11 is a perspective view of a laminated ceramic capacitor according to still another embodiment of the present invention.
Figure 12:
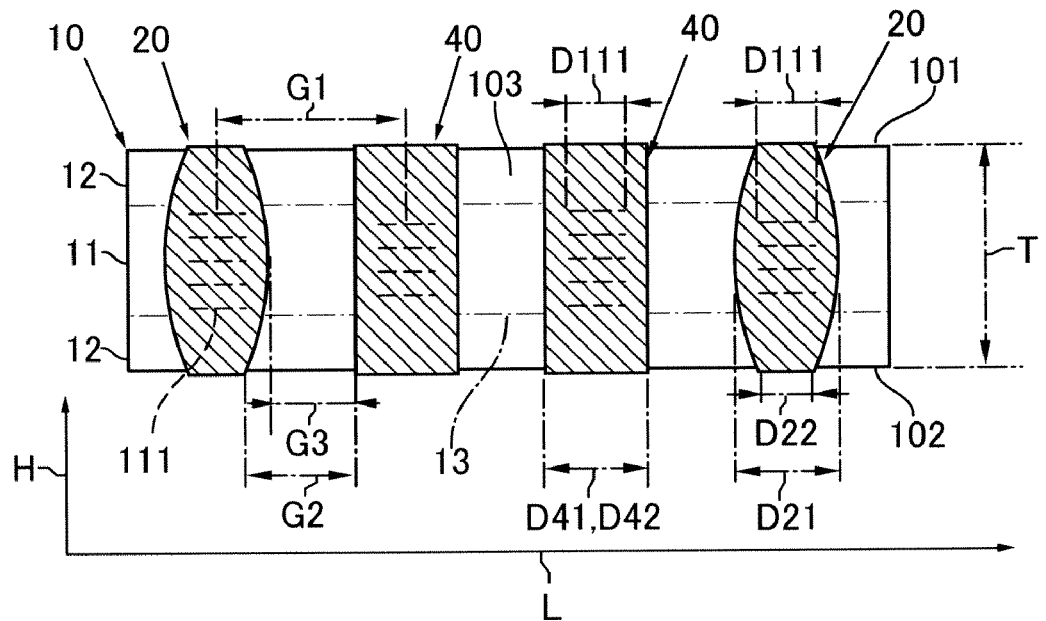
FIG. 12 is a side view of the laminated ceramic capacitor shown in FIG. 11.
Figure 13:
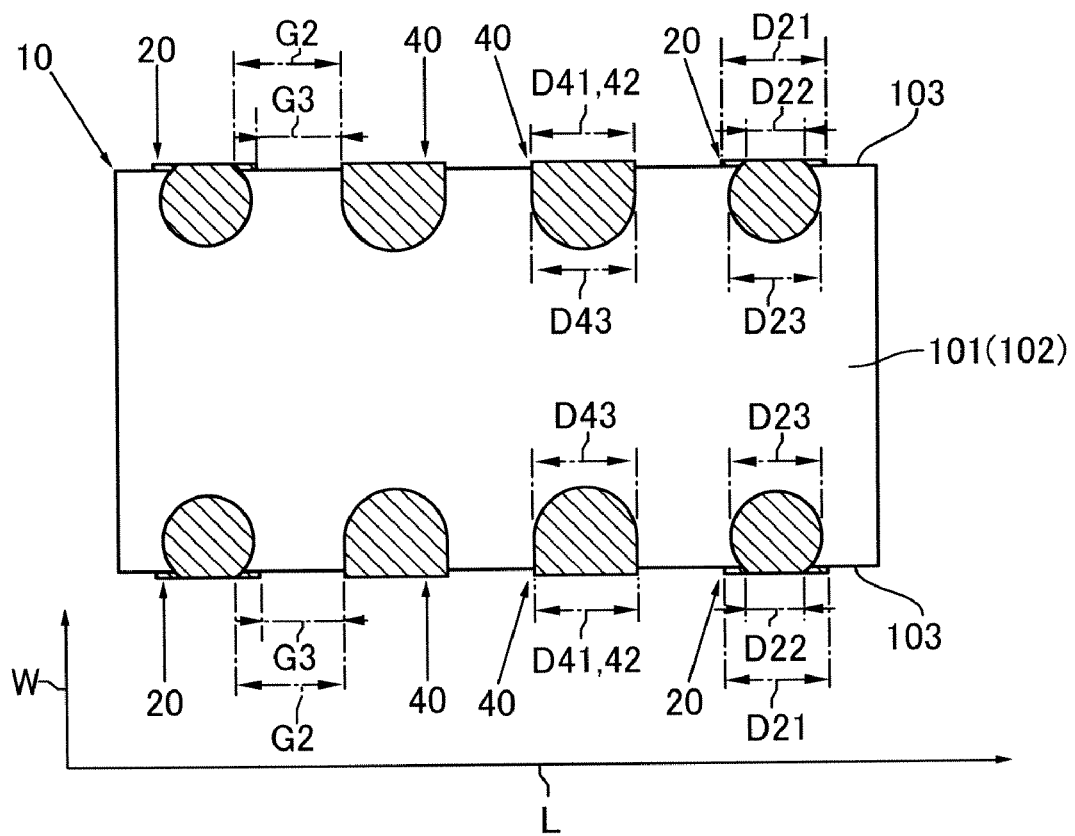
FIG. 13 is a plan view of the laminated ceramic capacitor shown in FIG. 11.
Figure 14:
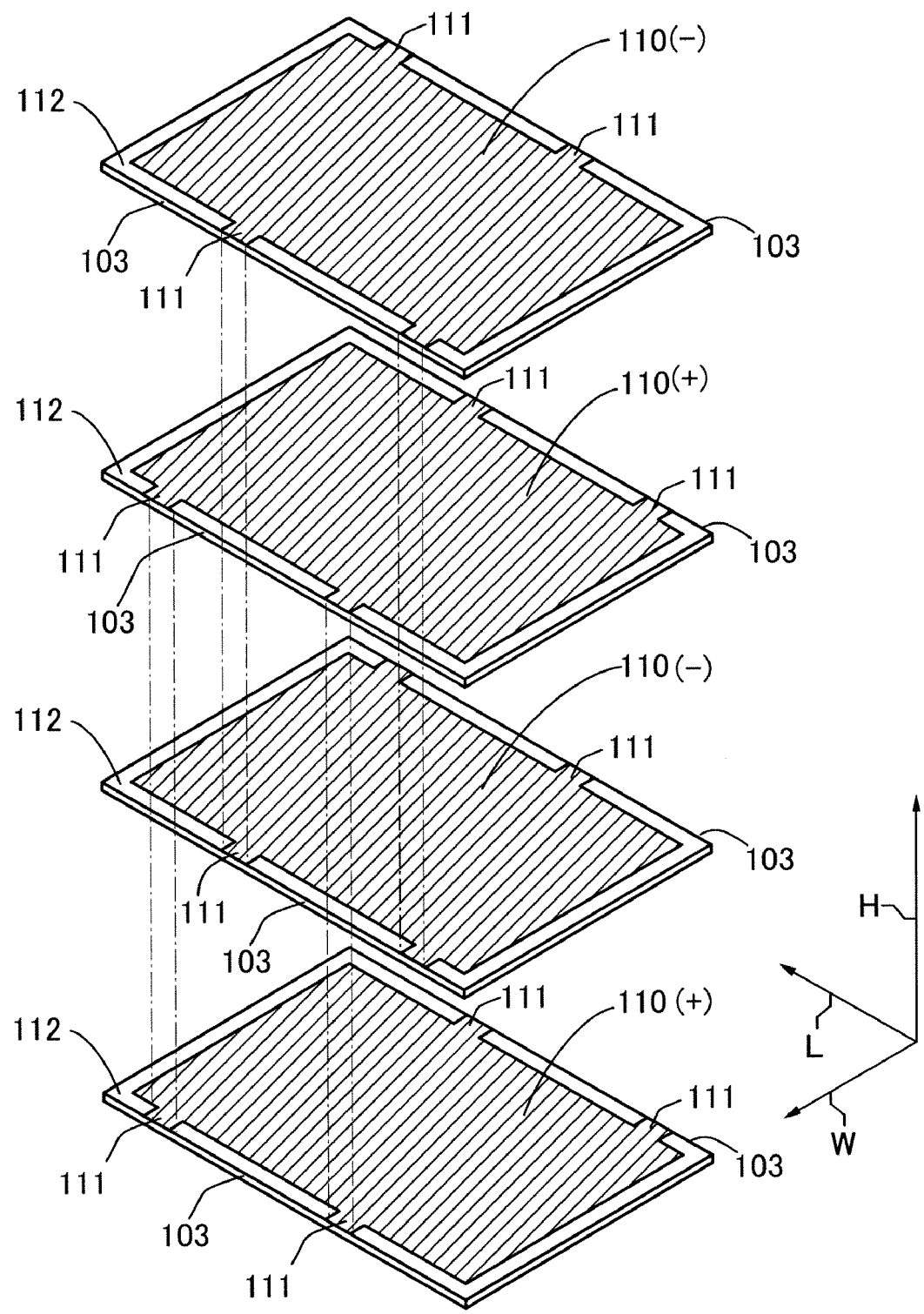
FIG. 14 is an exploded perspective view showing a layered structure of an inner layer portion of the laminated ceramic capacitor shown in FIG. 11.

FIGS. 8 to 10 show a laminated ceramic capacitor which has all the advantages described with reference to FIGS. 1 to 7 but is provided with terminal electrodes according to another embodiment of the present invention. In detail, the laminated ceramic capacitor shown in FIGS. 8 to 10 has first terminal electrodes 20 and second terminal electrodes 30.

The first terminal electrodes 20 are identical to those described with reference to FIGS. 1 to 7 and disposed at both ends of the body 10 in the length direction L. The second terminal electrodes 30 are disposed between these first terminal electrodes 20 and each have end portions 32 at opposite ends of an intermediate portion 31 in the height direction H.

The intermediate portion 31 has an electrode width D31, which is larger than the electrode width D111 of the led-out portion 111, and extends generally linearly along the height direction H in an area of the side face 103 corresponding to the inner layer portion 11, thereby covering the led-out portion 111. With this configuration, undesirable exposure of the led-out portion 111 can be certainly prevented.

On the other hand, the end portion 32 is gradually narrowed from one end of the intermediate portion 31 toward an edge of the side face 103. More specifically, the end portion 32 lies in an area of the side face 103 corresponding to the outer layer portion 12 and has a tapered-shape of which a width change starting point is located at a boundary 13 between the inner layer portion 11 and the outer layer portion 12 and a width change ending point is located at the edge of the side face 103. In the second terminal electrode 30 shown in FIGS. 8 to 10, the boundary 13 between the inner layer portion 11 and the outer layer portion 12 almost coincides with a boundary between the intermediate portion 31 and the end portion 32. Also in this configuration, the distance G2 between the end portions 22, which is kept larger than the distance G3, reduces the risk of occurrence of solder bridging across the area having a distance varying from G3 to G2 during soldering to a mounting substrate, thereby preventing short-circuit failure.

FIGS. 11 to 14 show a laminated ceramic capacitor having third terminal electrodes 40 in addition to the first terminal electrodes 20 described above with reference to FIGS. 1 to 7. The third terminal electrode 40 is a conventional type of terminal electrode of which an intermediate portion 41, end portions 42 and grounding portions 43 have the same electrode width (D41=D42=D43). This configuration also provides the laminated ceramic capacitor with all the advantages described above with reference to FIGS. 1 to 10 and reduces the risk of occurrence of solder bridging across the area having a distance varying from G3 to G2 at least at both ends of the body 10 in the length direction L where the first terminal electrodes 20 are disposed, thereby preventing short-circuit failure.

In the laminated ceramic capacitor shown in FIGS. 11 to 14, furthermore, the internal electrode 110 has four led-out portions 111, two of which can be led out to one of the side faces 103 opposing each other in the width direction W. With this configuration, the internal electrodes can be led out in a variety of ways.

While the present invention has been particularly shown and described with reference to embodiments thereof, it will be understood by those skilled in the art that various changes in form and detail may be made therein without departing from the spirit, scope and teaching of the invention.

What is claimed is:

1. A laminated ceramic capacitor comprising a body and a plurality of terminal electrodes,
    wherein said body has an inner layer portion and an outer layer portion,
    said inner layer portion has a plurality of internal electrodes stacked in a height direction of said body,
    said internal electrodes have led-out portions led out to a side face of said body,
    said outer layer portion is disposed on at least one of opposite faces of said inner layer portion in said height direction,
    said terminal electrodes are spaced apart from each other in a length direction of said body perpendicular to said height direction and each extend along said height direction to cover corresponding one of said led-out portions,
    at least outermost ones of said terminal electrodes in said length direction are each provided with an intermediate portion and an end portion,
    said intermediate portion has a larger electrode width than said led-out portion, and
    said end portion has a smaller electrode width at an edge of said side face than said intermediate portion.

2. The laminated ceramic capacitor of claim 1, wherein said end portion has an electrode width equal to or larger than an electrode width of said led-out portion.

3. The laminated ceramic capacitor of claim 2, wherein said outermost terminal electrode has a tapered-shape whose electrode width gradually decreases from said intermediate portion toward said end portion.

4. The laminated ceramic capacitor of claim 3, wherein said outermost terminal electrode is further provided with a grounding portion disposed on one face of said body and electrically connected to said end portion at said edge of said side face.

5. The laminated ceramic capacitor of claim 4, which satisfies:

$$D22<D23<D21,$$

where D23 represents a maximum electrode width of said grounding portion, and where in D21 represents a maximum electrode width of said intermediate portion, and D22 represents an electrode width of said end portion.

6. The laminated ceramic capacitor of claim 2, wherein all said terminal electrodes are each provided with said intermediate portion and said end portion.

7. The laminated ceramic capacitor of claim 2, which satisfies:

$$1.10 \leq D21/D22 \leq 1.50,$$

where D21 represents a maximum electrode width of said intermediate portion, and D22 represents an electrode width of said end portion.

8. The laminated ceramic capacitor of claim 7, wherein said outermost terminal electrode is further provided with a grounding portion disposed on one face of said body and electrically connected to said end portion at said edge of said side face.

9. The laminated ceramic capacitor of claim 8, which satisfies:

$$D22<D23<D21,$$

where D23 represents a maximum electrode width of said grounding portion.

10. The laminated ceramic capacitor of claim 2, wherein said outermost terminal electrode is further provided with a grounding portion disposed on one face of said body and electrically connected to said end portion at said edge of said side face.

11. The laminated ceramic capacitor of claim 10, which satisfies:

$$D22<D23<D21,$$

where D23 represents a maximum electrode width of said grounding portion, and where in D21 represents a maximum electrode width of said intermediate portion, and D22 represents an electrode width of said end portion.

12. The laminated ceramic capacitor of claim 1, wherein said outermost terminal electrode has a tapered-shape whose electrode width gradually decreases from said intermediate portion toward said end portion.

13. The laminated ceramic capacitor of claim 12, wherein said outermost terminal electrode is further provided with a grounding portion disposed on one face of said body and electrically connected to said end portion at said edge of said side face.

14. The laminated ceramic capacitor of claim 13, which satisfies:

$$D22<D23<D21,$$

where D23 represents a maximum electrode width of said grounding portion, and where in D21 represents a maximum electrode width of said intermediate portion, and D22 represents an electrode width of said end portion.

15. The laminated ceramic capacitor of claim 1, wherein all said terminal electrodes are each provided with said intermediate portion and said end portion.

16. The laminated ceramic capacitor of claim 1, which satisfies:

$$1.10 \leq D21/D22 \leq 1.50,$$

where D21 represents a maximum electrode width of said intermediate portion, and D22 represents an electrode width of said end portion.

17. The laminated ceramic capacitor of claim 16, wherein said outermost terminal electrode is further provided with a grounding portion disposed on one face of said body and electrically connected to said end portion at said edge of said side face.

18. The laminated ceramic capacitor of claim 17, which satisfies:

$$D22<D23<D21,$$

where D23 represents a maximum electrode width of said grounding portion.

19. The laminated ceramic capacitor of claim 1, wherein said outermost terminal electrode is further provided with a grounding portion disposed on one face of said body and electrically connected to said end portion at said edge of said side face.

20. The laminated ceramic capacitor of claim 19, which satisfies:

$$D22<D23<D21,$$

where D23 represents a maximum electrode width of said grounding portion, and where in D21 represents a maximum electrode width of said intermediate portion, and D22 represents an electrode width of said end portion.

* * * * *